(12) United States Patent
Chen et al.

(10) Patent No.: US 9,318,413 B2
(45) Date of Patent: Apr. 19, 2016

(54) INTEGRATED CIRCUIT STRUCTURE WITH METAL CAP AND METHODS OF FABRICATION

(71) Applicant: GLOBALFOUNDRIES INC., Grand Cayman (KY)

(72) Inventors: Fen Chen, Williston, VT (US); Andrew T. Kim, Poughkeepsie, NY (US); Minhua Lu, Mohegan Lake, NY (US); Timothy D. Sullivan, Underhill, VT (US); Ping-Chuan Wang, Hopewell Junction, NY (US); Lijuan Zhang, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 132 days.

(21) Appl. No.: 14/065,451

(22) Filed: Oct. 29, 2013

(65) Prior Publication Data
US 2015/0115459 A1 Apr. 30, 2015

(51) Int. Cl.
*H01L 23/48* (2006.01)
*H01L 21/768* (2006.01)
*H01L 23/522* (2006.01)

(52) U.S. Cl.
CPC ........ *H01L 23/481* (2013.01); *H01L 21/76898* (2013.01); *H01L 21/76849* (2013.01); *H01L 23/5226* (2013.01); *H01L 2924/0002* (2013.01)

(58) Field of Classification Search
CPC .......................... H01L 21/6898; H01L 23/481
USPC ........... 257/621, 751, 774; 438/627, 637, 643
See application file for complete search history.

(56) References Cited

U.S. PATENT DOCUMENTS

| | | | |
|---|---|---|---|
| 7,064,064 B2 * | 6/2006 | Chen ................. | H01L 21/76834 257/E21.576 |
| 7,190,079 B2 | 3/2007 | Andricacos et al. | |
| 7,651,906 B2 | 1/2010 | Park et al. | |
| 7,816,945 B2 | 10/2010 | Feng et al. | |
| 8,211,756 B2 | 7/2012 | Feng et al. | |
| 8,288,270 B2 | 10/2012 | Farooq et al. | |
| 8,299,612 B2 | 10/2012 | West et al. | |
| 8,304,863 B2 | 11/2012 | Filippi et al. | |
| 2003/0098510 A1 | 5/2003 | Trivedi et al. | |
| 2003/0122259 A1 | 7/2003 | Bobba et al. | |
| 2003/0148603 A1 | 8/2003 | Gardner | |
| 2007/0063313 A1 | 3/2007 | Barth et al. | |

(Continued)

FOREIGN PATENT DOCUMENTS

EP        0289274 A2    11/1988

OTHER PUBLICATIONS

Shayan et al., "3D Stacked Power Distribution Considering Substrate Coupling", IEEE, 2009, pp. 225-230.

(Continued)

*Primary Examiner* — Matthew W Such
*Assistant Examiner* — Warren H Kilpatrick
(74) *Attorney, Agent, or Firm* — Michael LeStrange; Hoffman Warnick

(57) ABSTRACT

The present disclosure generally provides for an integrated circuit (IC) structure with a TSV, and methods of manufacturing the IC structure and the TSV. An IC structure according to embodiments of the present invention may include a through-semiconductor via (TSV) embedded within a substrate, the TSV having an axial end; and a metal cap contacting the axial end of the TSV, wherein the metal cap has a greater electrical resistivity than the TSV.

19 Claims, 10 Drawing Sheets

(56) References Cited

U.S. PATENT DOCUMENTS

| | | | |
|---|---|---|---|
| 2008/0073747 A1 | 3/2008 | Chao et al. | |
| 2010/0182041 A1 | 7/2010 | Feng et al. | |
| 2011/0254165 A1 | 10/2011 | Muranaka | |
| 2012/0031768 A1 | 2/2012 | Reid et al. | |
| 2012/0119374 A1 | 5/2012 | Rahman et al. | |
| 2012/0153458 A1 | 6/2012 | Howard et al. | |
| 2012/0199983 A1 | 8/2012 | Farooq et al. | |
| 2012/0258408 A1 | 10/2012 | Mayer et al. | |
| 2012/0280395 A1 | 11/2012 | Farooq et al. | |
| 2012/0292779 A1 | 11/2012 | Interrante et al. | |
| 2012/0313247 A1 | 12/2012 | Yu et al. | |
| 2012/0322261 A1 | 12/2012 | Shue et al. | |
| 2013/0015504 A1* | 1/2013 | Kuo | H01L 21/84 257/213 |
| 2014/0264869 A1* | 9/2014 | Huang | H01L 23/53238 257/751 |
| 2014/0346680 A1* | 11/2014 | Gers | H01L 21/76898 257/774 |
| 2015/0021784 A1 | 1/2015 | Lin | |
| 2015/0061147 A1* | 3/2015 | Lin | H01L 23/53238 257/774 |

OTHER PUBLICATIONS

Swaminathan, Electrical Design and Modeling Challenges for 3D System Integration, DesignCon2012, 31 pages.

Kilpatrick, Office Action Communication for U.S. Appl. No. 14/065,454 dated May 22, 2015, 20 pages.

Kilpatrick, Office Action Communication for U.S. Appl. No. 14/065,454 dated Nov. 20, 2015, 27 pages.

* cited by examiner

INTEGRATED CIRCUIT STRUCTURE WITH METAL CAP AND METHODS OF FABRICATION

BACKGROUND

Embodiments of the invention relate generally to structures of integrated circuits (ICs). More specifically, the disclosure relates to through-semiconductor via (TSV) structures with a metal cap, and methods of fabricating those structures.

TSVs are electrically conductive structures extending through a semiconductor layer or wafer for coupling two or more components on either side of the semiconductor material. In conventional structures, the TSV is substantially perpendicular to a metal layer. This structure may cause electric current to follow a substantially "L" shaped path from the metal layer into the TSV. Typically, current density in this structure is highest at the elbow of the current path.

High current density and local joule heating in one portion of the TSV may cause the TSV to experience electromigration degradation. "Electromigration" refers to physical motion of atoms out of areas where current density is very high. Electromigration is caused primarily by frictional force between metal ions and flowing electrons. Electromigration may damage a metal line or via.

Risk of electromigration can be greatest at a surface of a TSV, where metal contacts a dielectric interface. Over time, electromigration can cause thermal and tensile stresses in portions of semiconductor wiring structures. Thermal and tensile stresses may create "voids." In general, a "void" is a portion of wiring composed substantially of empty space, and therefore having a high electrical resistance. If voiding occurs, the risk of electromigration damage in the TSV can further increase.

SUMMARY

According to one embodiment of the present invention, an integrated circuit (IC) structure may comprise a through-semiconductor via (TSV) embedded within a substrate, the TSV having an axial end; and a metal cap contacting the axial end of the TSV, wherein the metal cap has a greater electrical resistivity than the TSV.

According to another embodiment of the present invention, a method of fabricating a through-semiconductor via (TSV), may comprise forming a TSV structure in a substrate, the TSV structure having an exposed first axial end; and forming a metal cap on the exposed first axial end of the TSV structure, wherein the metal cap has a greater electrical resistivity than the TSV structure.

According to an additional embodiment of the present invention, a method of fabricating a through-semiconductor via (TSV) may comprise forming a sacrificial collar about an axial end of a TSV structure; removing the sacrificial collar; forming a metal cap on the axial end of the TSV structure, wherein a portion of the metal cap is located about the axial end of the TSV structure.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Features of the present disclosure include an integrated circuit (IC) structure. Generally, the IC structure can include a through-semiconductor via (TSV) embedded within a substrate. The TSV may have one or more axial ends. To reduce current crowding within the TSV, a metal cap with greater electrical resistivity than the TSV can contact one of the axial ends of the TSV.

Figure 1:
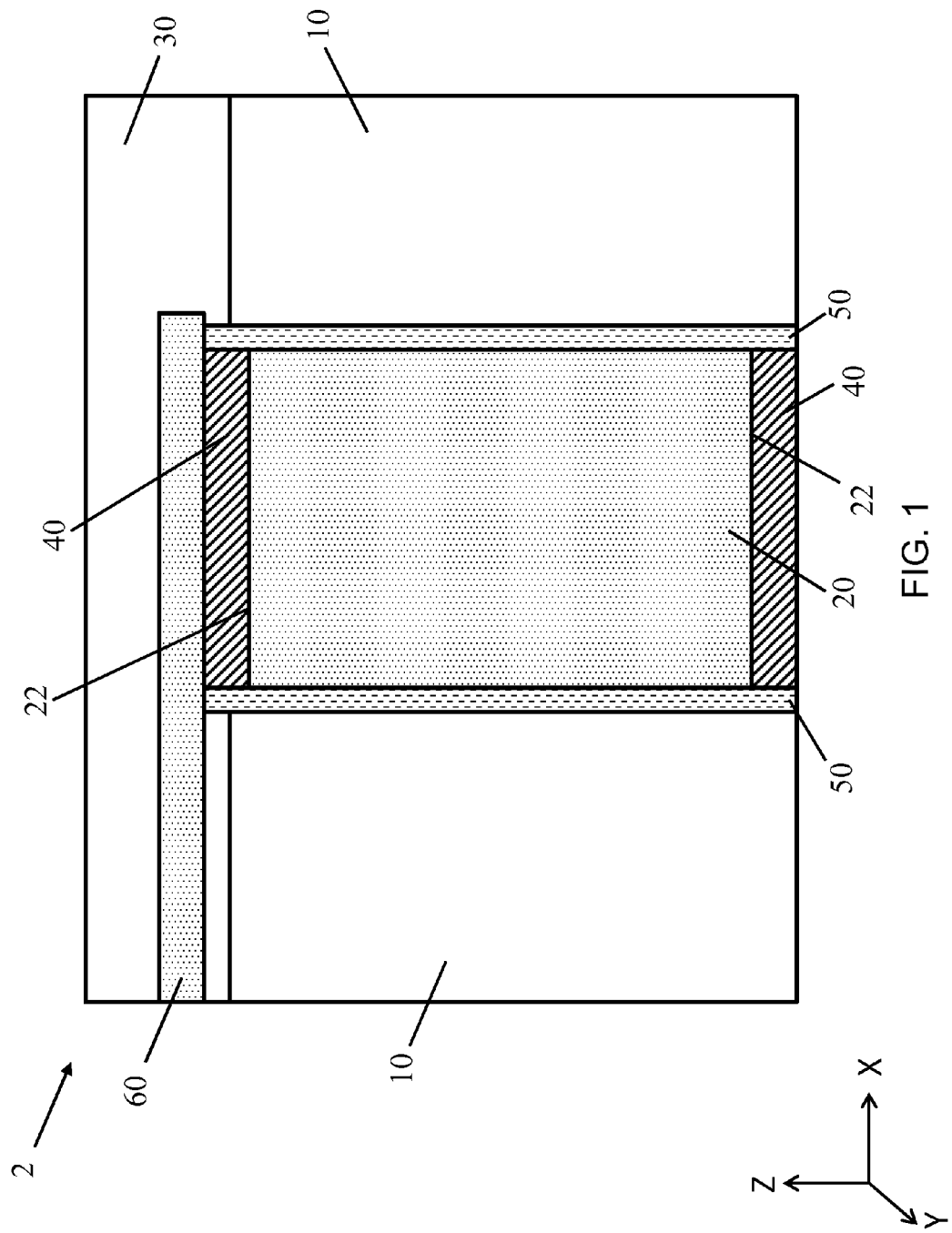
FIG. 1 shows a cross sectional view in plane X-Z of an IC structure according to an embodiment of the present disclosure.

Referring to the drawings, FIG. 1 depicts an integrated circuit (IC) structure 2 according to an embodiment of the present disclosure. IC structure 2 can include a substrate 10. Substrate 10 of IC structure 2 can be a wafer in a larger semiconductor structure. Materials used in the composition of substrate 10 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Other components of IC structure 2 may be connected to or in contact with portions of substrate 10 as described herein.

A through-semiconductor via (TSV) 20 may be embedded within substrate 10. As known in the art, a TSV may refer to an electrically conductive via etched through a substrate or semiconductor "wafer" to provide a wafer-to-wafer interconnect scheme compatible with 3D wafer-level packaging. Each TSV can be used to connect metal wires of a semiconductor to other components powered by electric current. TSVs may be composed of electrically conductive metals such as copper, aluminum, tungsten, and silver. TSV 20 may include one or more axial ends 22.

A dielectric layer 30 may be adjacent to substrate 10. As known in the art, a "dielectric" refers to an electrically insulative material that substantially blocks the flow of electric current. As such, dielectric layer 30 essentially defines an insulative barrier between electrically connected components of a semiconductor structure. Common dielectrics may include but are not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

One or more metal caps 40 may contact an axial end 22 of TSV 20. Metal cap 40 may have higher electrical resistivity than TSV 20 by being composed of an electrically conductive material that is more resistive than the material composition of TSV 20. Some electrically conductive materials suitable for metal cap 40 can include a refractory metal, a transition metal, a combination of refractory and/or transition metals, or any alloy made from refractory and/or transition metals. As used herein, "transition metals" may include metals with valence electrons in two atomic energy levels instead of only one, such as metals from groups three through twelve of the periodic table. Specifically, each metal cap 40 can include copper, cobalt, nickel, tungsten, titanium, palladium, molybdenum, manganese, gold, and/or iron, in addition to alloys made from these materials. A "refractory metal" may include, for example, ruthenium; however, other refractory metals such as tantalum (Ta), titanium (Ti), tungsten (W), iridium (Ir), rhodium (Rh) and platinum (Pt), etc., or mixtures thereof, may also be employed. In addition, "refractory metals" include TiN, TaN, CoW, and/or an alloy of one or more metals. Any of the substances described herein as an example of a transition metal and/or a refractory metal can be used alone or in combination. If desired, only one metal cap 40 may be used within IC structure 2. In addition or alternatively, two metal caps 40 may each contact an axial end 22 of TSV 20. Further, additional metal caps (not shown) can be layered onto an axial end 22 of TSV 20 to create a conductive region between TSV 20 and other components of IC structure 2 with higher electrical resistivity than TSV 20.

As electric current enters metal cap 40, the resistive material provided therein may cause electric current to disperse throughout a radial cross section of metal cap 40. Metal cap 40 may disperse electric current because electric current is most dense in regions of low electrical resistance, and therefore any current traveling through metal cap 40 will spread out as a result of electrons traveling through the material of metal cap 40 more slowly. Consequently, current entering TSV 20 from metal cap 40 will be relatively distributed across axial end 22 as compared to conventional IC structures, where metal cap 40 does not contact TSV 20. Metal cap 40 may reduce the risk of electromigration in TSV 20 by causing current to disperse radially before entering TSV 20, because of the higher electrical resistivity in metal cap 40. Metal cap may suppress the surface diffusion of electrons entering TSV 20, which is one of the leading causes of the electromigration degradation. As a result, current entering TSV 20 is less likely to pass through a region prone to electromigration, such as the interface between TSV 20 and a liner 50.

Liner 50, e.g., of refractory metals, materials made from refractory metals, and/or an additional oxide/nitride dielectric layer can be present between TSV 20 and substrate 10. Some example materials for use in liner 50 can include titanium nitride (TiN), tantalum nitride (TaN), tantalum (Ta), and titanium (Ti). Though liner 50 can be provided alongside any component of IC structure 2 discussed herein, liners 50 are shown only alongside metal cap 40 and TSV 20 in FIG. 1 for the sake of clarity. Liner 50, by being made of relatively resistive materials such as refractory metals, can reduce or prevent outflow of electric current from TSV 20 into other components of IC structure 2.

A metal layer 60 may be embedded within dielectric layer 30 and/or coupled to TSV 20. As used herein, the term "metal layer" may include a layer of an IC structure that includes a metal wire embedded in a dielectric, such as dielectric layer 30. Metal wires used in components of IC structure 2, such as metal layer 60, may include conductive metals such as copper, aluminum, tungsten, and silver. Metal layer 60 may have been formed in a back end of line process. "Back end of line" (BEOL) processes can refer to operations performed on a semiconductor wafer in the course of device manufacturing, after a first metallization. Accordingly, metal layer 60 can include a BEOL metal layer embedded in an IC structure on one side of a semiconductor wafer or layer, such as substrate 10.

Figure 2:
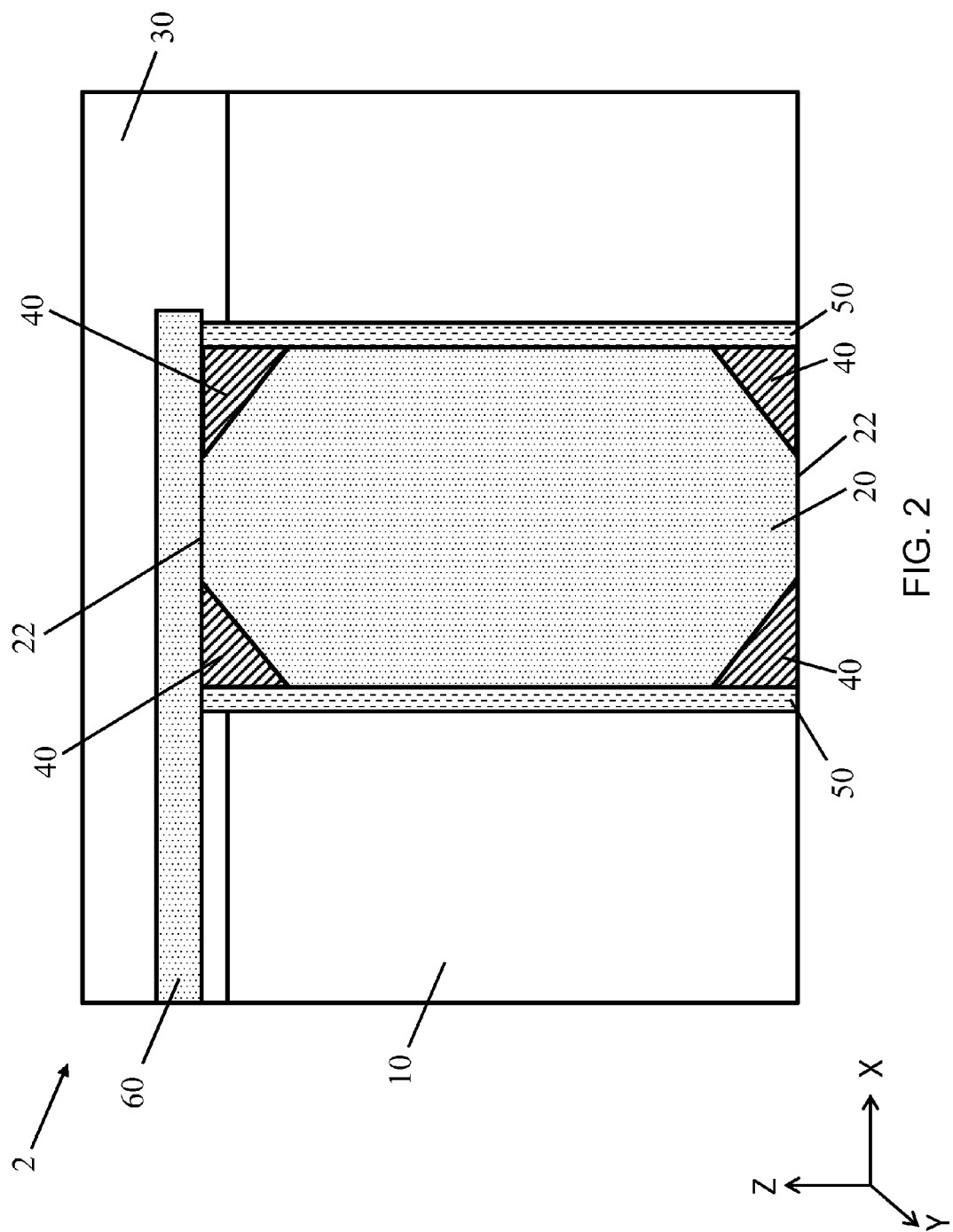
FIG. 2 shows a cross sectional view in plane X-Z of an alternative IC structure according to an embodiment of the present disclosure.

Turning to FIG. 2, another embodiment of IC structure 2 is shown. It is understood that in embodiments of the invention, metal cap 40 can be formed in any desired shape or group of shapes. In the example embodiment of FIG. 2, metal cap 40 can have a hollow core, thereby being in a substantially "annular" shape. In addition, a surface of metal cap 40 can be axially tapered, as shown in FIG. 2, thereby providing a greater cross section of resistive material at one radial position of metal cap 40 than at another. In some embodiments, TSV 20 may extend through metal cap 40, causing axial end 22 to be radially surrounded by metal cap 40. In the embodiment shown in FIG. 2, axial end 22 may contact other components, such as metal layer 60. Metal cap 40, by allowing TSV 20 to extend through a portion thereof, may cause electric current entering TSV 20 to concentrate most at a region of axial end 22 where TSV 20 is exposed because metal cap 40 has greater electrical resistivity than the exposed region of axial end 22. In this way, current entering TSV 20 can be less crowded in regions where metal cap 40 is relatively thick.

Figure 3:
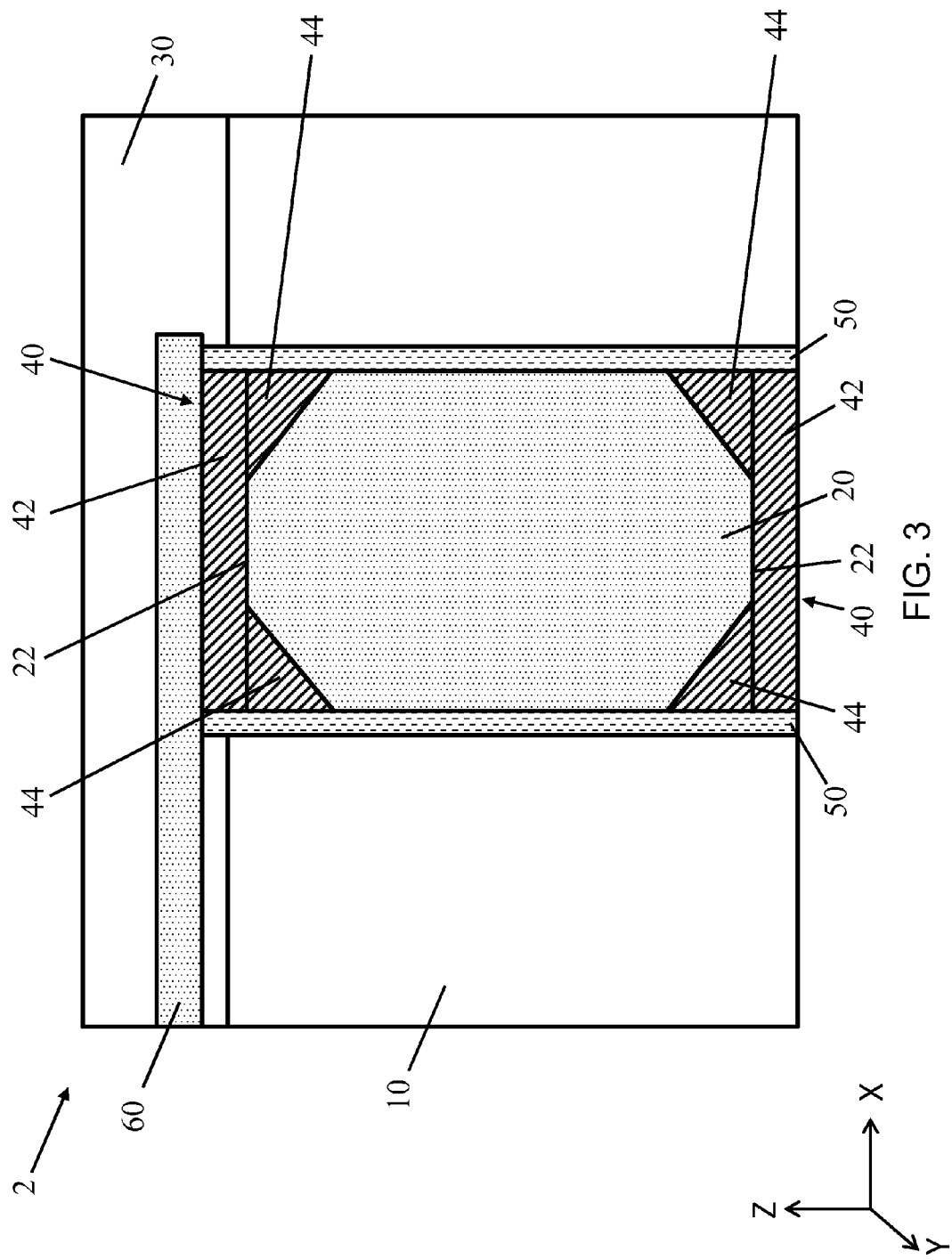
FIG. 3 shows a cross sectional view in plane X-Z of an additional IC structure according to an embodiment of the present disclosure.

Turning to FIG. 3, an alternative embodiment of IC structure 2 is shown. If desired, metal cap 40 can be subdivided into two sections. Metal cap 40 can include a substantially cylindrical first section 42, structured similarly to the embodiment of metal cap 40 in FIG. 1. In addition, a substantially annular second section 44 can be adjacent to first section 42. If desired, each section 42, 44 can be formed together onto axial end 22 of TSV 20 as a single metal cap 40. By combining substantially cylindrical and substantially annular sections 42, 44, the current density within metal cap 40 and TSV 20 can be customized by using different arrangements of resistive material.

First section 42 and second section 44, having greater electrical resistivity than TSV 20, can distribute current throughout metal cap 40 before it enters TSV 20. As current travels through metal cap 40 toward TSV 20, the substantially annular shape of second section 44 causes electric current to concentrate most at the relatively conductive center of TSV 20 as the current travels through IC structure 2. Thus, current density can be increased at the center of TSV 20 while being reduced at the circumference of TSV 20, where electromigration is most likely to occur. To concentrate current density at the center of TSV 20, an axial thickness along axis Z of metal cap 40 can be lowest at a radial center of metal cap 40. In addition, an axial thickness along axis Z of metal cap 40 can be greatest at a radial perimeter of metal cap 40 and TSV 20. Current density within metal cap 40 can be greatest where the axial thickness of metal cap 40 is smallest, because the material composition of metal cap 40 can have more electrical resistivity than the material composition of TSV 20. If desired the axial thickness of metal cap 40 along axis Z can be greatest in a different region, causing electric current entering TSV 20 from metal cap 40 to be most concentrated in the different region. It is understood that other embodiments of IC structure 2 similar to that shown in FIG. 3 are contemplated. For example, FIG. 10 (discussed in further detail below) shows a metal cap 40 without axial tapering in a substantially annular section.

Figure 4:
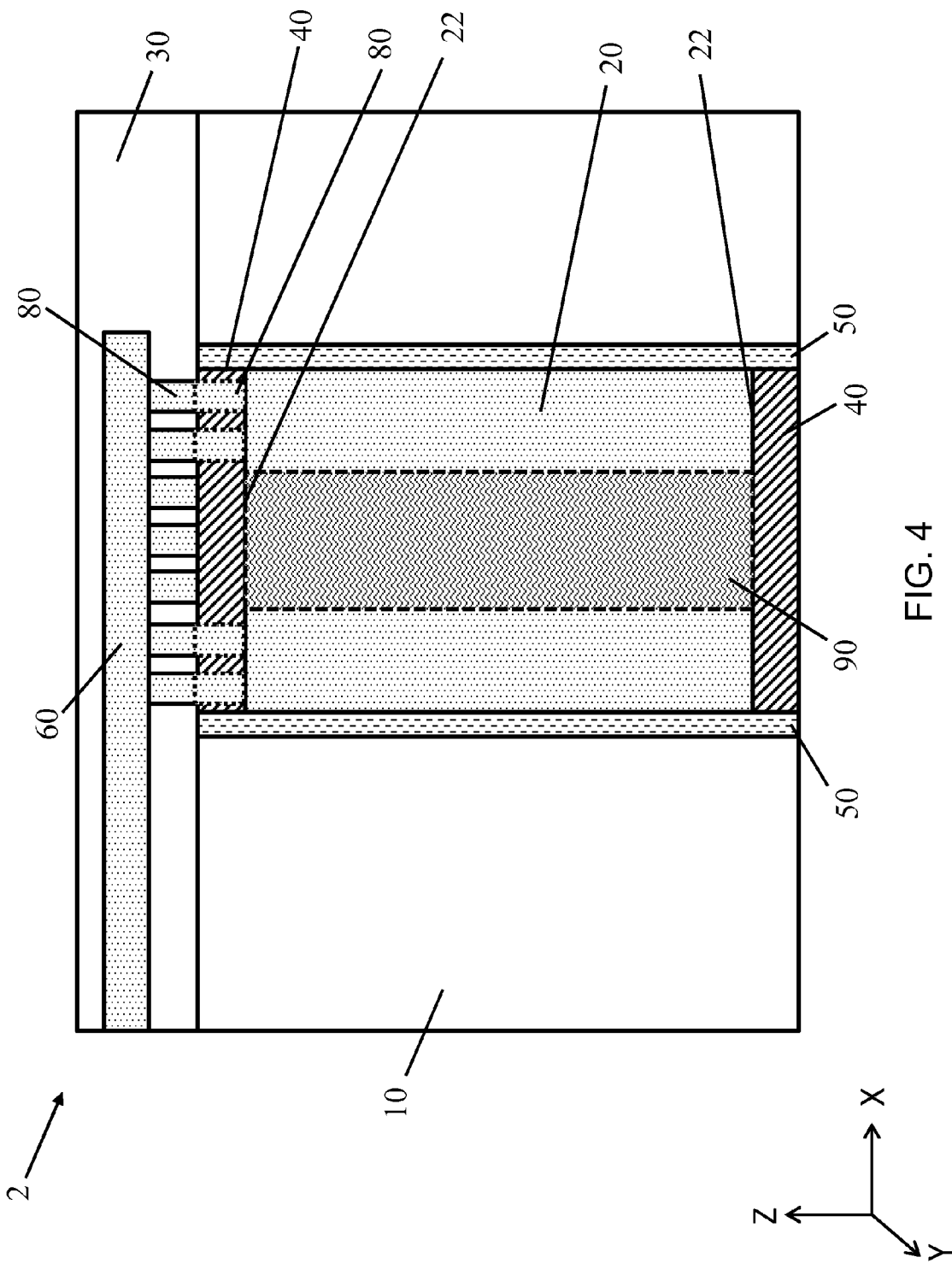
FIG. 4 shows a cross sectional view in plane X-Z of a modified IC structure according to an embodiment of the present disclosure.

Turning to FIG. 4, another example embodiment of IC structure 2 is shown. Additional, optional components can be added to IC structure 2 to improve current distribution within TSV 20. For example, one or more vias 80 can electrically couple metal layer 60 to TSV 20 and/or metal cap 40. In some embodiments, vias 80 can be composed of a different material from metal cap 40 and extend, for example, through regions of metal cap 40 shown in phantom. Where vias 80 extend through metal cap 40, some electric current can exit vias 80 and pass through metal cap 40 before entering TSV 20 in response to vias 80 having a high current density. As a result, current density within TSV 20 can be reduced because electric current is redistributed by passing through vias 80 before entering TSV 20. Several vias 80 can couple TSV 20 with metal layer 60 or other metal wires (not shown).

As also shown in FIG. 4, IC structure 2 may optionally include a silicon pillar 90 (shown in phantom) embedded within TSV 20. Silicon pillar 90 may be electrically insulative, thereby forcing current to enter conductive regions of TSV 20 outside silicon pillar 90 to increase the distribution of electric current within TSV 20. The remaining conductive areas of TSV 20 may be substantially or partially annular. In embodiments of IC structure 2 with vias 80, each via 80 can be coupled to TSV 20 outside the perimeter of silicon pillar 90. Some electric current entering TSV 20 from vias 80 may flow through metal cap 40 before entering TSV 20, while vias 80 direct most current entering TSV 20 to remain outside of silicon pillar 90.

Embodiments of the present disclosure also include methods of fabricating a through-semiconductor via (TSV). A TSV fabricated according to the methods described herein may have some or all of the properties discussed above with respect to IC structure 2 (FIGS. 1-4). Specifically, methods according to the present disclosure may yield a TSV with a metal cap in contact with an axial end thereof. The metal cap may have greater electrical resistivity than the TSV, to reduce the risk of electromigration by radially distributing current throughout the TSV.

Figure 5:
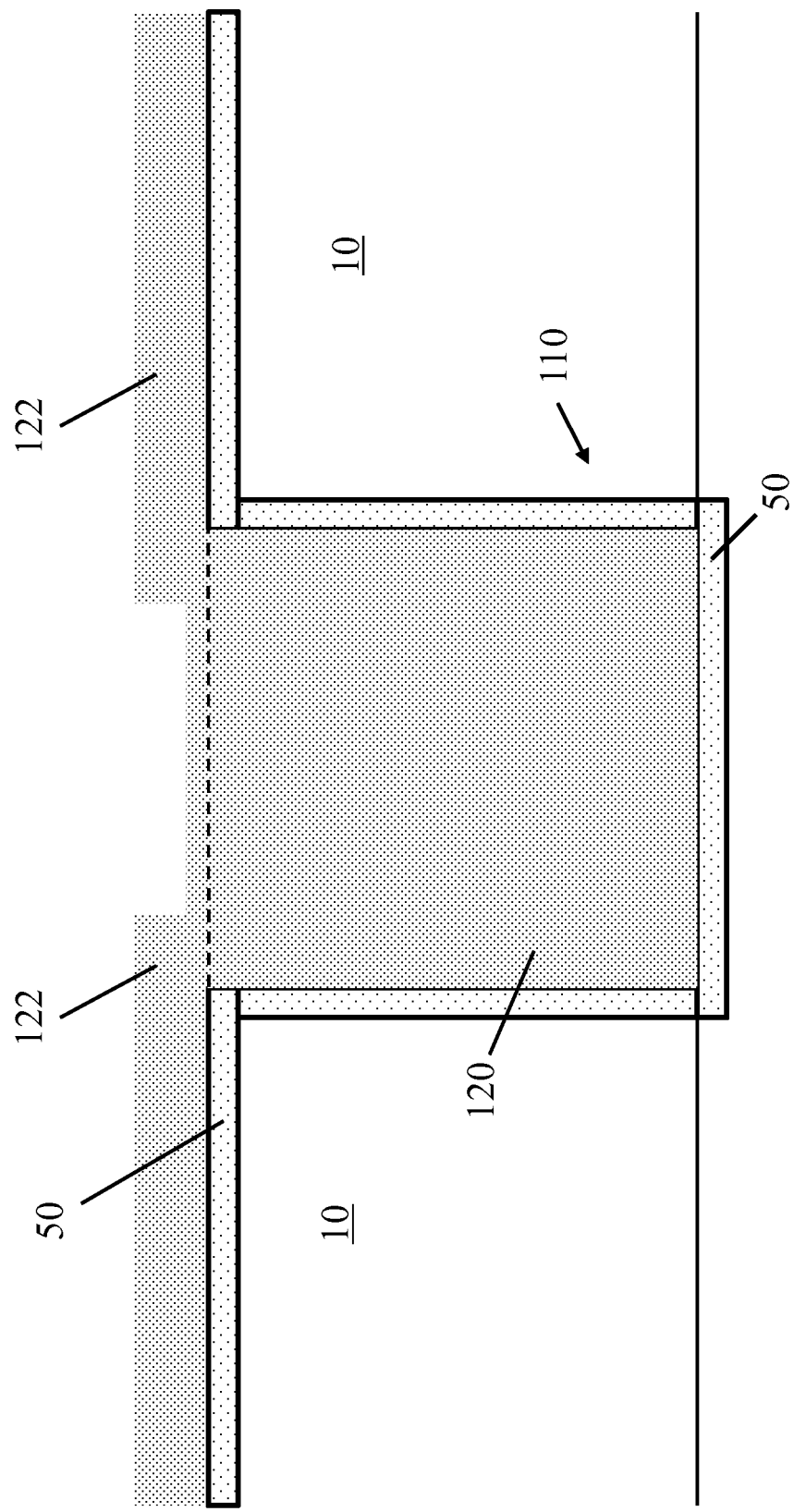
FIGS. 5-7 depict cross-sectional views of a substrate and TSV structure undergoing processes according to various embodiments of the present disclosure.

FIG. 5 depicts a process according to embodiments of the present disclosure, the process including forming a TSV structure in a TSV opening of a substrate. An opening 110 may be formed in substrate 10, and substrate 10 can be coated with a dielectric insulating layer (not shown). The opening can be coated with liners 50, and then filled with a conductive metal (e.g., copper, aluminum, tungsten, or silver) to form a TSV structure 120. As TSV structure 120 is formed, excess material outside TSV structure 120 may appear in the form of a plate 122. As an example, TSV structure 120 and plate 122 may be formed by depositing a layer of metal onto substrate 10 and/or liner 50. As used herein, "depositing" a material (e.g., TSV structure 120 and/or plate 122) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed. After TSV structure 120 is formed and embedded within substrate 10, over-burden plate 122 of excess material may be created in the form of a continuous material over TSV structure 120, liner 50, and/or substrate 10.

Figure 6:
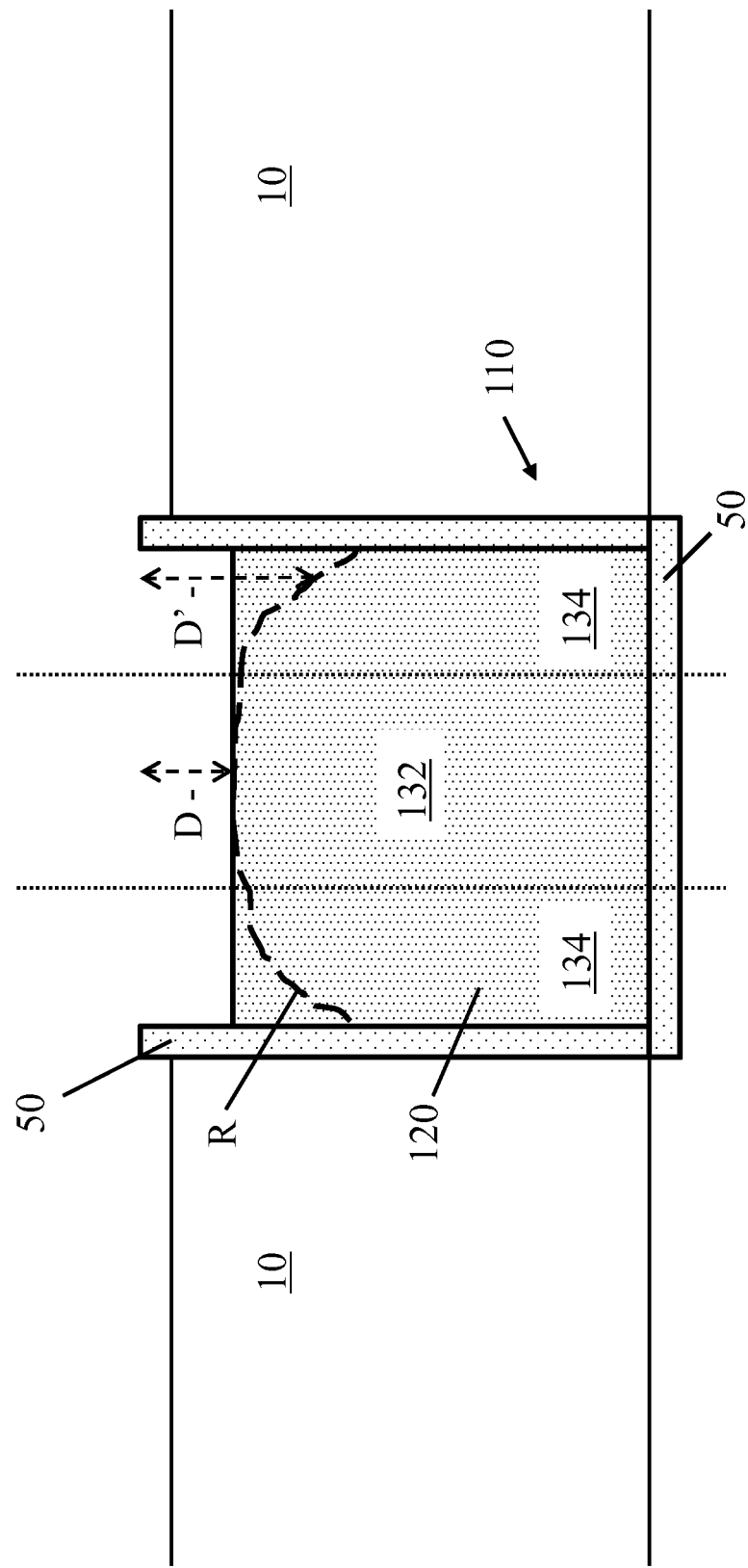

Turning to FIG. 6, the process can include removing at least a portion of plate 122 (FIG. 5) and/or a portion of TSV structure 120, to expose TSV structure 120 from the surface of substrate 10. In an embodiment, as shown in FIG. 6, plate 122 (FIG. 5) may be completely recessed from covering TSV structure 120 by various material removal or polishing techniques now known or later developed, e.g., CMP, polishing, reactive ion etch (RIE), etc. As used herein, "CMP" or "chemical-mechanical polishing" refers to a method of removing layers of solid by chemical-mechanical polishing carried out for the purpose of surface planarization and definition of a metal interconnect pattern, as is done in back-end of line (BEOL) IC manufacturing. In addition, "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

Additionally, as shown in FIG. 6, a portion of TSV structure 120 may be removed. More specifically, portions of TSV structure 120 extending into depth D and/or depth D' may be removed by a material removal process (e.g., etching). In some embodiments, the process of removing or etching plate 122 (FIG. 5) and a portion of TSV structure 120 may create substantially flat axial end. Additionally or alternatively, the process of removing or etching a portion of plate 122 (FIG. 5) and a portion of TSV structure 120 may create a radially inner region 132 and a radially outer region 134, with the upper surface of TSV structure 120 having a profile similar to phantom line R. To create radially inner and outer regions 132, 134 at different depths, the interface between liner 50 and TSV structure 120 may be etched at a greater rate than the remainder of TSV structure 120, thereby creating a corner curvature in radially outer region 134.

Figure 7:
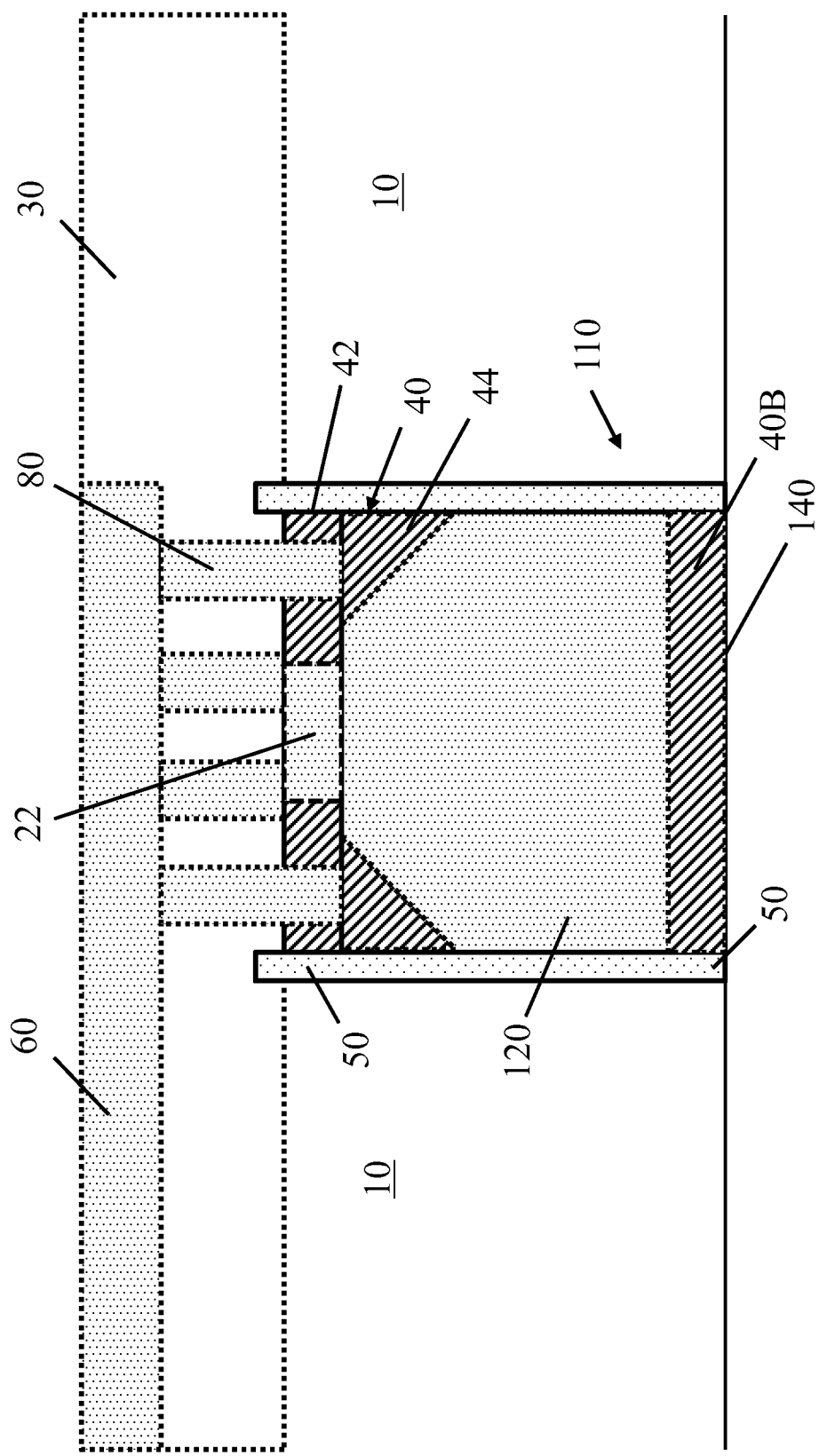

FIG. 7 depicts an additional process according to embodiments of the present disclosure, the process including forming a metal cap on an exposed first axial end of a TSV structure. The metal cap formed according to embodiments of the present invention may have a greater electrical resistivity than TSV structure 120. The results of other, optional processes are also shown in phantom in FIG. 7 and discussed in further detail elsewhere herein. In an embodiment, metal cap 40 may be formed by using any now known or later developed process of forming or depositing a metal structure. For example, metal cap 40 may be formed by any conventional depositing process (e.g., chemical vapor deposition) and may be planed by any now known or later developed process (e.g., CMP) for providing a contact surface for bonding to another component. In some embodiments, dielectric layer 30, liner 50, and/or other components may also be formed on metal cap 40 and substrate 10, and then bonded thereto by a currently known or later developed bonding technique, such as direct bonding, reactive bonding, adhesive bonding, etc. Metal layer 60 (shown in phantom) may in turn be deposited onto metal cap 40 and/or substrate 10 according to any one or more of the depositing processes described herein. In embodiments where etching TSV structure 120 creates radially inner region 132 (FIG. 6) and radially outer region 134 (FIG. 6) of TSV structure 120, deposited metal cap 40 may include a substantially cylindrical first section 42 and a substantially annular second section 44 (shown in phantom). Substantially annular second section 44 can engage TSV structure 120 at its radially outer region to create a flat surface, to which substantially cylindrical first section 42 can be adjacent. In some embodiments, a portion of end 22 (shown in phantom) of TSV structure 120 may not be removed. As a result, TSV structure 120 may have an axial end 22 extending through the axial thickness of metal cap 40 and adjacent to dielectric layer 30.

In an embodiment, another surface 140 of substrate 10 may undergo a wafer thinning process, including but not limited to backgrinding, polishing, and/or other forms of wafer thinning currently known or later developed. Following the wafer thinning of surface 140, another metal cap 40B can be formed on TSV structure 120, coplanar with surface 140. Metal cap 40B may be formed using any currently known or later developed process of forming or depositing a metal structure. For example, metal cap 40B may be formed by any conventional depositing process (e.g., CVD) and may be planed by any currently known or later developed process (e.g., CMP) for providing a contact surface for bonding to another component. In addition, metal cap 40B can have a substantially cylindrical section and/or a substantially annular section by undergoing the processes described elsewhere herein with respect to depositing metal cap 40.

Further processes, such as photolithography, can allow components such as vias 80 (shown in phantom) to be coupled to metal cap 40 and/or TSV structure 120. Generally, lithography and photolithography include processes used to transfer a pattern from a mask or reticle to a photoresist layer deposited on the surface of a substrate. In photolithography, a pattern can be created by forming a photoresist layer on a substrate, masking portions of the photoresist layer, and then removing or etchings not covered by the mask. Following the deposition of dielectric layer 30, a portion thereof may be etched according to any currently known or later developed process of etching a structure, such as reactive ion etching (RIE). Following the etching of dielectric layer 30, a liner (not shown) can be bonded to the etched portion where via 80 can be installed. Vias 80 can be sized to occupy the etched portions of dielectric structure 30. Following the etching of dielectric layer 30, vias 80 may be formed within the etched portions of dielectric layer 30 by one or more of the processes for depositing or forming of components (e.g., chemical vapor deposition) discussed elsewhere herein. Portions of dielectric layer 30 can be removed according to any currently known or later developed process for removing portions of a component, such as reactive ion etching (RIE). In some embodiments, a plurality of vias 80 can be formed, with each via 80 coupling metal layer 60 with metal cap 40 or TSV structure 120, as shown in FIG. 7. Each of the plurality of vias 80, after being formed, can be at least partially embedded within dielectric layer 30.

In an embodiment, each via 80 may be composed of a different material from metal cap 40 and may extend therethrough. To embed a single via in both dielectric layer 30 and metal cap 40, portions of dielectric layer 30 and metal cap 40 can be removed together in a process such as etching, thereby exposing an area of TSV structure 120. Vias 80 can be formed and embedded within dielectric layer 30 and metal cap 40 through any currently known or later developed method of forming a via. For example, vias 80 can be formed through a "damascene process." As used herein, a "damascene process" can refer to a process in which metal wires or vias are delineated in dielectric substances, isolating them from each other by chemical-mechanical planarization (CMP). Specifically, an interconnect pattern can be lithographically defined in dielectric layer 30 and metal cap 40, and then metal may be formed or deposited to fill resulting trenches. Any excess material is removed by means of planarization techniques, such as CMP. Damascene processes can also be used to form vias in other embodiments discussed elsewhere herein.

Figure 8:
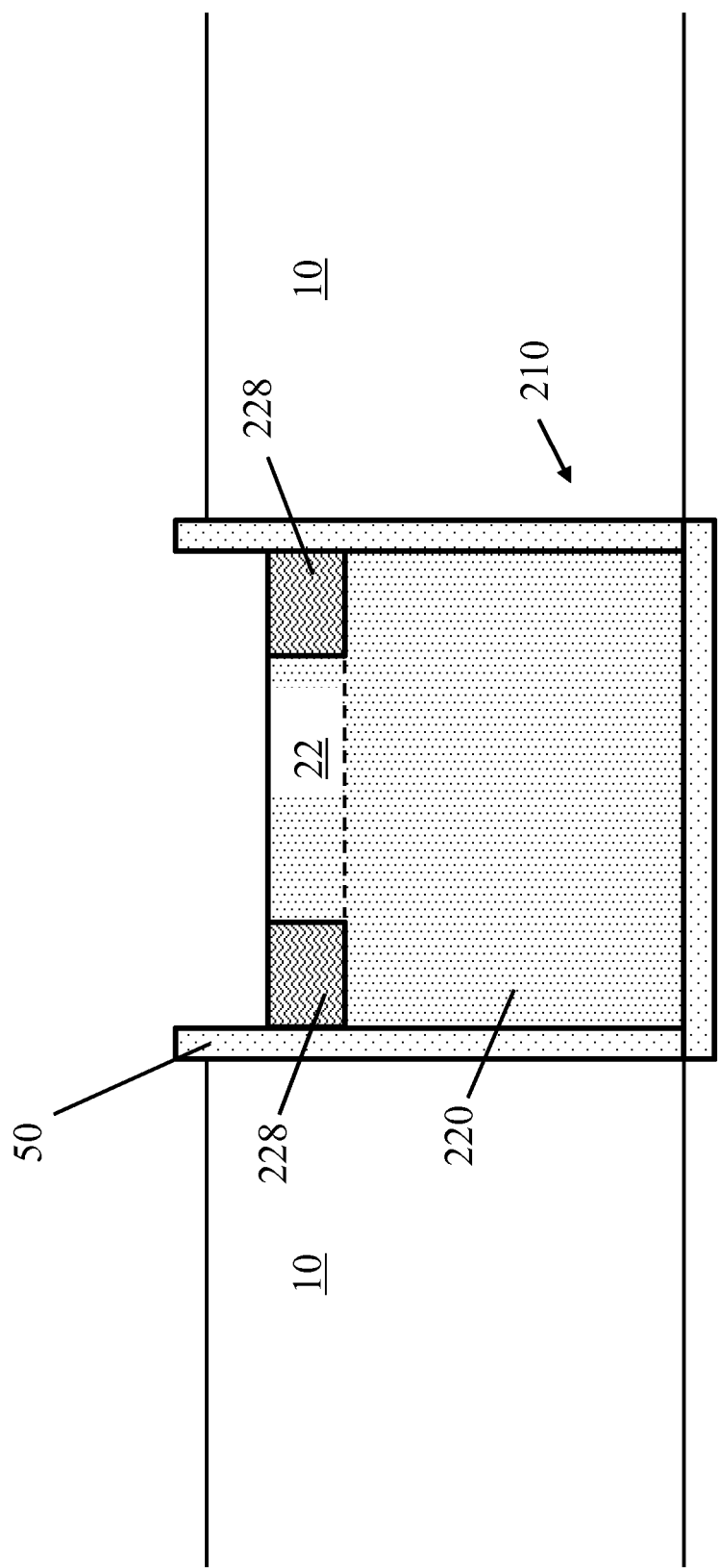
FIGS. 8-10 depict cross sectional views of a TSV opening and TSV structure undergoing processes according to various embodiments of the present disclosure.

FIG. 8 depicts a process of fabricating a TSV according to embodiments of the present disclosure, the process including forming a sacrificial collar about an axial end of a TSV structure. In an embodiment, substrate 10 may include a TSV opening 210, which may be coated with insulating dielectric and a liner 50. TSV opening 210 may be formed in substrate 10 by any currently known or later developed process for removing a material, such as depositing a photoresist layer, patterning the photoresist layer, etching, and removing the photoresist layer. As shown in FIG. 8, TSV opening 210 exposes a TSV structure 220 and any components formed or placed thereon. TSV structure 220 may be composed of an electrically conductive metal (e.g. copper, aluminum, tungsten, and/or silver) or other conductive substance. A TSV structure 220 may be embedded within TSV opening 210 and may be formed by a forming process discussed elsewhere herein with respect to TSV structure 120. Furthermore, a sacrificial collar 228 can be formed about axial end 22 of TSV structure 220.

As shown in FIG. 8, a sacrificial collar 228 is formed over TSV structure 220. Sacrificial collar 228 may be formed over TSV structure 220 according to one or more of the various deposition techniques discussed elsewhere herein, in addition to other techniques now known or later developed. Sacrificial collar 228 may be composed of a sacrificial material such as amorphous carbon, polysilicon, oxide, nitride, and/or any other conventional material that may be easily removed from TSV structure 220. The sacrificial material, after being formed, may be a continuous layer that contacts the formed photoresist (not shown). To create the collar shape of sacrificial collar 228, some portions of the sacrificial material can be bonded to liner 50 and/or the interior surface of TSV opening 210 by any currently known or later developed bonding process, while remaining portions of the sacrificial material are removed, for example, by etching. After sacrificial collar 228 is formed, the photoresist can be removed (e.g., by being stripped), and the portions of TSV opening 210 previously occupied by the photoresist can be filled with metal and polished to form TSV structure 220. TSV structure 220 and sacrificial collar 228 (FIG. 8) can optionally be polished through CMP or other currently known or later developed polishing techniques.

Figure 9:
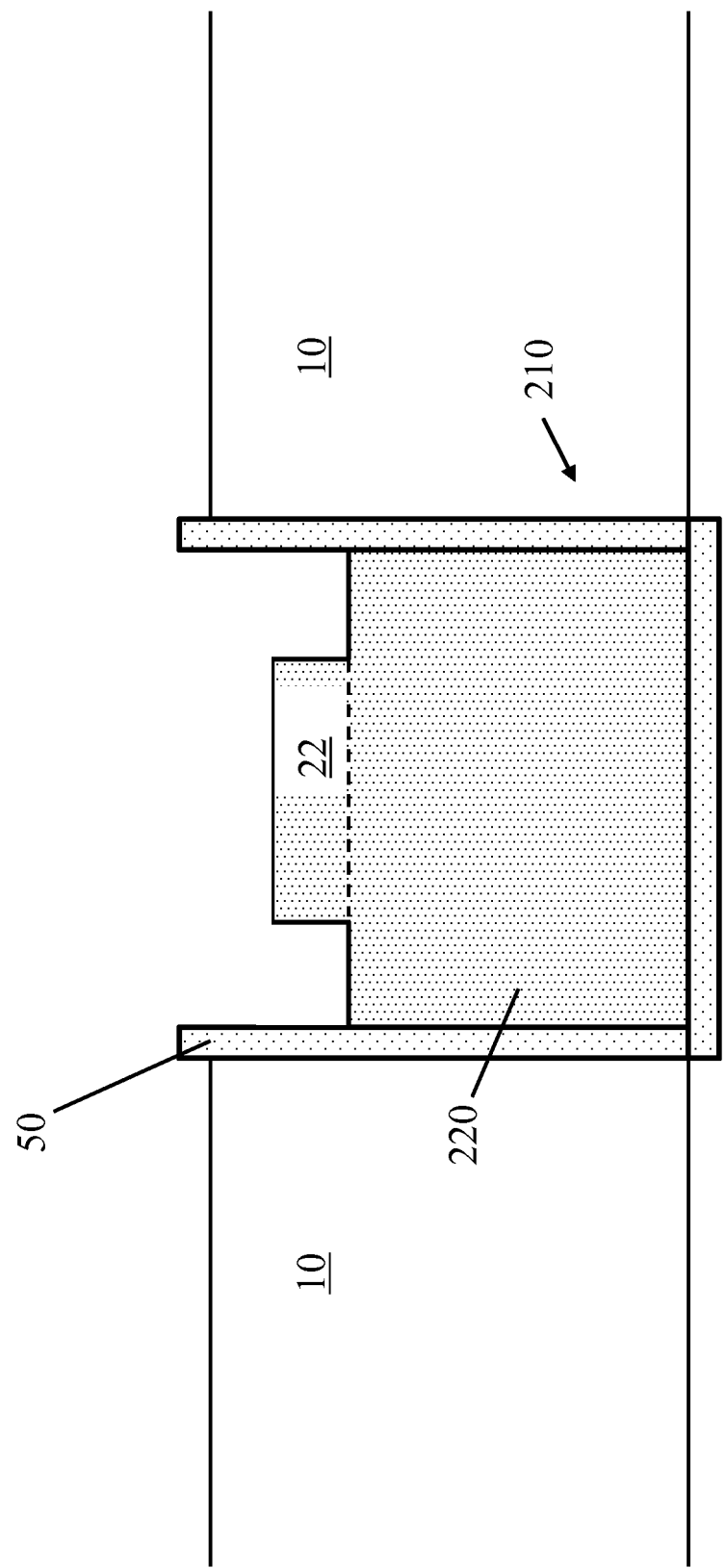

Turning to FIG. 9, sacrificial collar 228 (FIG. 8) is shown to have been removed from TSV structure 220. Sacrificial collar 228 (FIG. 8) and/or portions thereof can be removed by various material removal techniques now known or later developed, e.g., etching (wet etching, reactive ion etch (RIE), etc.). As shown in FIG. 9, TSV structure 220 may have an axial end 22 projecting therefrom, following the plating of TSV opening 210 and removal of sacrificial collar 228.

Figure 10:
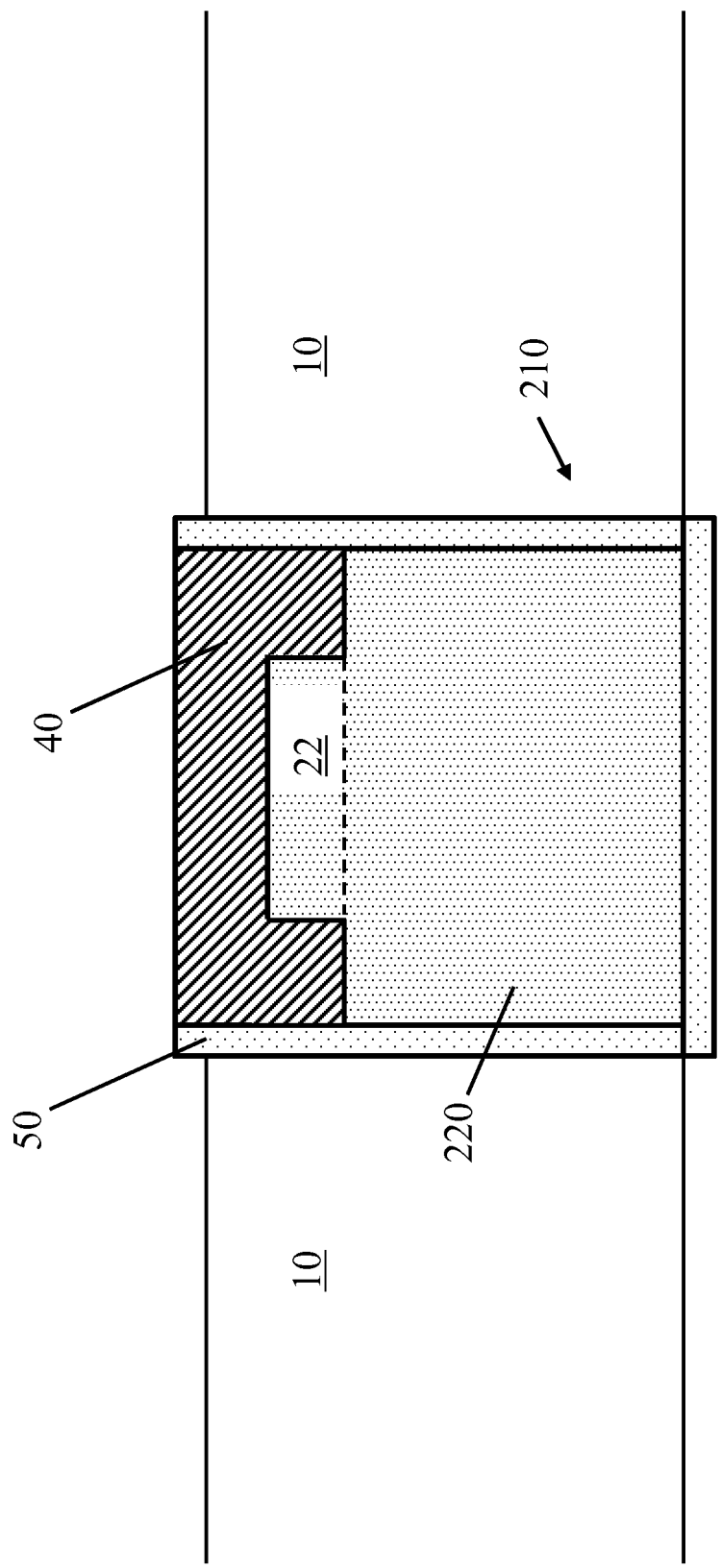

Turning now to FIG. 10, a metal cap 40 can be deposited onto TSV structure 220 and axial end 22. The portions of TSV opening 210 (FIGS. 8, 9) previously occupied by sacrificial collar 228 (FIG. 8) can be used as a location for depositing metal cap 40. To distribute current throughout TSV structure 220, metal cap 40 can include a material of higher electrical resistivity than TSV structure 220. For example, metal cap 40 can be composed of transition metals and/or refractory metals. Metal cap 40 can be deposited according to any currently known or later developed deposition technique discussed elsewhere herein. In addition or alternatively, metal cap 40 can be formed within TSV opening 210 (FIGS. 8, 9) above TSV structure 220 and axial end 22 by a currently known or later developed plating process, such as electroless selective plating. The TSV with metal cap can optionally be polished through CMP or other currently known or later developed polishing techniques.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure comprising:
    a through-semiconductor via (TSV) embedded within a substrate, the TSV having an axial end;
    a dielectric layer adjacent to the substrate;
    a liner contacting the TSV and positioned about the TSV;
    a metal cap contacting the axial end of the TSV, wherein the metal cap has a greater electrical resistivity than the TSV;
    a metal layer embedded in the dielectric layer and in contact with the metal cap and the liner, wherein the metal layer has a lower electrical resistivity than the metal cap, and wherein an interface between the metal layer, the liner, and the metal cap forms an elbow junction;
    a first via extending from an axial end of the metal layer to the axial end of the TSV, wherein the first via forms an electrical connection between the metal layer and the TSV through the metal cap; and
    a second via extending from the axial end of the metal layer to the metal cap such that a portion of the metal cap separates the second via from the TSV, wherein the second via is laterally interposed between the elbow junction and the first via.

2. The IC structure of claim 1, wherein the metal cap is substantially annular and radially surrounds the axial end of the TSV.

3. The IC structure of claim 1, wherein the metal cap includes at least one of a transition metal and a refractory metal.

4. The IC structure of claim 1, wherein an axial thickness of the metal cap is lowest at a radial center of the metal cap and greatest at a radial perimeter of the metal cap, and wherein an opposing axial surface of the TSV positioned beneath the second via includes a tapered profile.

5. The IC structure of claim 1, further comprising
    a via coupling the metal layer with the axial end of the TSV, wherein the via includes a different material from the metal cap and is embedded within the dielectric layer.

6. The IC structure of claim 5, further comprising a silicon pillar embedded within the TSV.

7. The IC structure of claim 6, wherein the via comprises a plurality of vias, each of the plurality of vias being coupled to a region of the axial end of the TSV outside a perimeter of the silicon pillar.

8. The IC structure of claim 1, further comprising another metal cap deposited onto another axial end of the TSV.

9. A method of fabricating a through-semiconductor via (TSV), the method comprising:
    forming a TSV structure in a substrate, the TSV structure having an exposed first axial end and a liner region positioned about a conductive region of the TSV;
    forming a metal cap on the exposed first axial end of the TSV structure, wherein the metal cap has a greater electrical resistivity than the TSV structure and wherein an upper surface of the metal cap is substantially coplanar with an upper surface of the liner region of the TSV structure;
    forming a dielectric layer on the substrate;
    removing a first portion of the dielectric layer to expose the TSV structure;
    removing a second portion of the dielectric layer to expose the metal cap;
    forming a plurality of vias within the dielectric layer, the plurality of vias including a first via in contact with the TSV structure and a second via in contact with the metal cap, such that a portion of the metal cap separates the second via from the TSV structure; and
    forming a metal layer over the metal cap and the liner region of the TSV structure to form an elbow junction between the metal layer and the TSV structure along the upper surfaces of the liner and the metal cap, wherein the metal layer has a lower electrical resistivity than the metal cap, and wherein the second via is laterally interposed between the elbow junction and the first via.

10. The method of claim 9, further comprising:
    thinning a surface of the substrate to expose a second axial end of the TSV structure; and
    forming another metal cap onto the exposed second axial end of the TSV structure.

11. The method of claim 9, further comprising removing portions of the TSV structure above a desired depth, before forming the metal cap.

12. The method of claim 11, wherein the removing includes etching.

13. The method of claim 11, wherein the TSV structure, after the removing, includes a radially inner region and a radially outer region, and the desired depth includes a desired depth of the radially inner region and a desired depth of the radially outer region.

14. The method of claim 13, further comprising removing a portion of the metal cap above the desired depth of the radially inner region, to expose a remaining portion of the metal cap and the radially inner region of the TSV structure.

15. The method of claim 9, further comprising:
    forming a dielectric layer on the substrate;

removing a portion of the dielectric layer, wherein the removing exposes one of the metal cap and the TSV structure; and forming a via on the TSV structure, wherein the metal layer is formed over and in contact with the via to yield an electrical connection between the metal layer and the TSV structure with lower electrical resistance than through the metal cap.

16. The method of claim 15, further comprising forming a plurality of vias on the TSV structure, wherein each of the plurality of vias is at least partially embedded within the metal cap.

17. A method of fabricating a through-semiconductor via (TSV), the method comprising:

forming a sacrificial collar about an axial end of a TSV structure;

removing the sacrificial collar; and forming a metal cap on the axial end of the TSV structure, wherein a portion of the metal cap is located about the axial end of the TSV structure, and wherein a liner region of the TSV structure is positioned about the metal cap;

forming a dielectric layer on at least the metal cap and the TSV structure;

removing a first portion of the dielectric layer to expose the TSV structure;

removing a second portion of the dielectric layer to expose the metal cap;

forming a plurality of vias within the dielectric layer, the plurality of vias including a first via in contact with the TSV structure and a second via in contact with the metal cap, such that a portion of the metal cap separates the second via from the TSV structure; and forming a metal layer over the metal cap and the liner region of the TSV structure to form an elbow junction between the metal layer and the TSV structure along the upper surfaces of the liner and the metal cap, wherein the metal layer has a lower electrical resistivity than the metal cap, and wherein the second via is laterally interposed between the elbow junction and the first via.

18. The IC structure of claim 5, wherein the metal cap further includes:

a substantially disc-shaped first section, and a substantially annular second section positioned about the first section, the second section having a greater axial width than the first section, wherein the second via extends through the second section of the metal cap.

19. The method of claim 15, wherein the metal cap further includes:

a substantially disc-shaped first section, and a substantially annular second section positioned about the first section, the second section having a greater axial width than the first section, wherein the second via extends through the second section of the metal cap.

* * * * *